US006703560B2

United States Patent
Coico et al.

(10) Patent No.: US 6,703,560 B2
(45) Date of Patent: Mar. 9, 2004

(54) STRESS RESISTANT LAND GRID ARRAY (LGA) MODULE AND METHOD OF FORMING THE SAME

(75) Inventors: Patrick Anthony Coico, Fishkill, NY (US); James H. Covell, Poughkeepsie, NY (US); Benjamin V. Fasano, New Windsor, NY (US); Lewis S. Goldman, Bedford, NY (US); Ronald L. Hering, Pleasant Valley, NY (US); Sundar M. Kamath, San Jose, CA (US); Kenneth Charles Marston, Wappingers Falls, NY (US); Frank Louis Pompeo, Redding, CT (US); Karl J. Puttlitz, Wappingers Falls, NY (US); Jeffrey Allen Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/838,454

(22) Filed: Apr. 19, 2001

(65) Prior Publication Data

US 2002/0050398 A1 May 2, 2002

Related U.S. Application Data

(63) Continuation-in-part of application No. 09/153,794, filed on Sep. 15, 1998, now abandoned.

(51) Int. Cl.$^7$ ............................................. H01L 23/02
(52) U.S. Cl. ....................................... 174/52.4; 257/704
(58) Field of Search ............................... 174/52.2, 52.4; 257/704, 706, 712

(56) References Cited

U.S. PATENT DOCUMENTS

| | | | |
|---|---|---|---|
| 5,053,922 A | | 10/1991 | Matta et al. ................ 361/722 |
| 5,132,875 A | * | 7/1992 | Plesinger .................... 361/704 |
| 5,142,444 A | | 8/1992 | Matta et al. ................ 361/720 |
| 5,276,961 A | | 1/1994 | Matta et al. .................. 29/827 |
| 5,572,070 A | | 11/1996 | Ross .......................... 257/713 |
| 5,724,729 A | | 3/1998 | Sherif et al. ................. 29/840 |
| 5,727,955 A | | 3/1998 | Tsubakihara ................. 439/71 |
| 5,990,418 A | * | 11/1999 | Bivona et al. ............. 174/52.4 |
| 6,065,530 A | * | 5/2000 | Austin et al. .............. 165/80.3 |

* cited by examiner

*Primary Examiner*—Hung V. Ngo
(74) *Attorney, Agent, or Firm*—Ira D. Blecker

(57) ABSTRACT

An integrated circuit module, a land grid array module, and a method for forming the module, include a substrate, which mounts one or more chips or discrete electronic components, and a cap for covering the substrate, and including at least one protrusion coupled to the cap for limiting the amount of flexing of the substrate during actuation. The at least one protrusion can be either rigidly fixed to the cap or adjustably inserted through the cap.

7 Claims, 7 Drawing Sheets

| | With Spar | Without Spar |
|---|---|---|
| Glass Ceramic max Z-deflection (mils) | 0.98 | 1.81 |
| Glass Ceramic max S1 Stress (MPa) | ~42 | ~68 |
| Cinch button load range (gm/10) | 134-213 | 119-200 |
| Thermal Paste Strain (% change) | 3.0-6.6 | 1.2-27.8 |

STRESS RESISTANT LAND GRID ARRAY (LGA) MODULE AND METHOD OF FORMING THE SAME

CROSS-REFERENCE TO RELATED APPLICATION

The present application is a Continuation-in-Part (CIP) of U.S. patent application Ser. No. 09/153,794, filed on Sep. 15, 1998 now abandoned, to Fasano et al., entitled "SOCKETABLE LAND GRID ARRAY (LGA) MODULE AND METHOD OF FORMING THE SAME" having IBM Docket No. FI9-98-039, assigned to the present assignee, and incorporated herein by reference.

BACKGROUND OF THE INVENTION

1. Field of the Invention

The present invention generally relates to a grid array module, and more particularly to a land grid array (LGA) module and a method for forming the same.

2. Description of the Related Art

Traditionally, electronic components, or modules, have been connected to circuit cards (or printed wiring boards (PWB)), by solder, either by pins inserted into plated through holes, or by direct solder attached to the PWB surface. The attachment of an electronic module to a PWB is generally referred to as a "second packaging level".

With the increasing complexity of PWBs and their components, reworking modules (e.g., removing modules defective or otherwise from a "card" and replacing the module) has become increasingly necessary, such that module reworkability is now an extremely important design criterion.

Reworking of soldered modules on location is difficult and expensive. Typically, a special apparatus is required for heating a selected module to a temperature beyond the melting point of the solder joints, without disturbing adjacent components.

In response to the demands of component rework, the Land Grid Array (LGA) concept has been developed. In LGA technology, contacts on the module are mechanically held against mating pads on the card, generally augmented by an array of springs functioning as an interposer. The spring array provides the necessary contact force to each module and PWB contact, while providing mechanical compliance to absorb vertical tolerances. The minimum allowable contact force is determined by the properties of the contact force to each module and the anticipated environmental exposure. Typical values are substantially within a range of about 50 grams-force to about 150 grams-force (0.49–1.47 Newtons per contact).

The LGA thus replaces a soldered interconnect array with an array of mechanical pressure contacts, which may be readily separated for module rework.

The LGA has the additional advantage (in addition to easier component rework) that thermal mismatch strains between module and PWB may be absorbed by contact sliding, or in sideways deformation of the interposer contact springs. However, the amelioration of thermal stress is replaced by the introduction of high mechanical forces, which must remain on the module and PWB throughout the product lifetime, and which can potentially compromise the structural integrity of this module.

Thus, land grid array socketing can subject a substrate or the like to a very high level of loading force (e.g., due to a heat sink pushing on a cooling cap affixed to the substrate through a "seal band") from the array of spring contacts. The loading is typically balanced by mechanical socket forces, which are distributed along the underside of the substrate.

Hence, the substrate undergoes essentially peripheral loading on the top and a distributed loading on the bottom. This imbalance can produce a substantial upward camber and mechanical bending stresses which remain as long as the module remains attached.

As a result, such unbalanced loading can break the substrate catastrophically (especially if made of a weaker material such as glass-ceramic or the like), can reduce the force on central contacts, thus compromising or destroying electrical performance, can squeeze out thermal paste used to thermally connect the chip to the cap, to a degree that it cannot recover during module rework, can squash chip-to-substrate interconnections, especially if not protected with an underfill. Further, the die may be fractured or the seal band damaged or broken.

The conventional methods and designs have attempted to solve the above problems by providing a thicker substrate (e.g., making the substrate have a thickness within a range of about 2 mm to about 8 mm depending on the application involved) and/or a more rigid substrate (e.g., by using stiffer materials, reinforcement members, or the like), but at the expense of performance, space and complexity of manufacturing.

FIG. 1 illustrates an example of a conventional multi-chip LGA module 1. The module 1 includes a substrate 2, which mounts one or more chips or discrete electronic components 3, and a cap 4. The cap 4 serves to mechanically protect the chip, and to provide a heat transfer path from the back of the chip 3 to the external cooling environment. To enhance heat transfer, a highly thermally conductive material 5, such as a paste containing ceramic, metal and/or metal oxide particles or the like, is typically placed between the back of the chip 3 and the cap 4. The cap 4 is attached to the substrate 2 along a peripheral band, or "picture frame"-like structure, by a thin layer of adhesive 6 (e.g., a so-called "seal band"). Preferably, the adhesive layer 6 forming the seal band has a thickness substantially within a range of about 10 $\mu$m to about 100 $\mu$m.

The substrate 2 is attached on the top to the chips or discrete devices 3 by an array of solder joints 7, which may be encapsulated with an underfill material 9 such as silica-filled epoxy or the like. Alternatively, the chips 3 may be back bonded and wire bonded to the substrate 2 (not shown). The bottom of the substrate 2 contains an array of metallized pads 8 which serve to subsequently interconnect the module to the printed wiring board 10. Thus, the module is formed.

The module 1 is clamped to the board 10 by a plate 11 (which may double as a heat sink, and which may have fins 15, to enhance heat transfer) or the like, which is attached to posts 12, which protrude from the board 10. The plate 11 may be attached to the posts 12 by screws or another suitable fastening mechanism, and which may be augmented by springs (not shown).

Alternatively, as shown in FIG. 2, the cover plate 11 (e.g., heat sink) may be shaped so as to attach directly to the board 10, thereby making the posts 12 unnecessary in this design. A soft medium (not shown), such as metal-filled grease, may be placed between the plate 11 and cap 4 to enhance heat transfer.

The substrate pads 8 are connected to mating pads 18, positioned on the surface of the PWB 10, generally through a spring carrier, or interposer, 19 containing LGA contacts 20, which is usually clamped to the board 10 together with the module 1. It is noted that while just two mating pads 18 are shown in FIG. 1, such pads 18 are provided along the entire underside of the substrate 2.

Referring now to FIG. 3, potentially damaging stress, shown by arrows 20 and 21, is imparted to the substrate 2 when the module 1 is attached, due to actuation forces (e.g., from the cover plate 11 (not shown in FIG. 3) and heat sink fins 15 (not shown) or the like) reaching the substrate 2, through the seal band 6.

Since the reaction force on the substrate 2 is not collinear with the seal band 6, but because the reaction force arises from the pads 8, the reaction force is distributed on the bottom surface of the substrate 2. This imbalance leads to upward flexure of the substrate 2, as shown by arrows 21.

Substrate flexure can cause a number of fatal problems, either immediately on actuation, or, even worse, over time. These include failure of the substrate 2 itself (e.g., either catastrophic fracture, internal line tearing, or surface via-via cracks), fracture of the chips 3, excessive squeeze-out of the heat transfer medium 5, delamination of the chip/substrate underfill 9, or rupture of the seal band 6. Clearly, as substrate size increases, or as its thickness decreases, the substrate's tendency to flex increases.

Minimizing substrate flexure under actuation loading thus becomes a critical factor in the performance and reliability of any LGA.

As mentioned above, several obvious steps have been attempted to remedy the above problems such as by providing for a thicker substrate, a rigid fill material between chip 3 and cap 4, and a very stiff seal band material. However, using any of these generally compromises some other attribute of the module, such as heat transfer or reworkability of the LGA assembly.

It is noted that in another conventional structure (disclosed in U.S. Pat. Nos. 5,757,620 and 5,819,402), directed to customizing a thermal cooling area by providing a different thermal coefficient thermal fluid or paste or compound for each chip in a multi-chip module (MCM), so that each chip can be cooled within its specific specifications, includes a plurality of chips positioned on a substrate. A heat sink or cap is attached to the substrate, and includes a plurality of extensions or partitions that form uniform cavities or blind holes, each for receiving a chip. Thermally conductive paste or grease typically fills the uniform cavity, and more specifically is provided between an upper surface of the chip and a lower surface of the heat sink or cap. The thermally conductive paste or grease provides the heat or thermal transfer path from the chip to the heat sink or cap.

However, such a structure would suffer from many of the same problems above, since the partitions or extensions are not for limiting an amount of flexing of the substrate during actuation. Specifically, unbalanced loading on the substrate may break the substrate and/or damage the chips positioned in the cavities, squeeze out the thermal paste used to thermally connect the chip to the cap, potentially squash chip-to-substrate interconnections, damage a seal band between the heat sink or cap and the substrate, and the like.

SUMMARY OF THE INVENTION

In view of the foregoing and other problems of the conventional methods and structures, it is a purpose of the present invention to provide a method and module design which protects a module from damage.

Another purpose is to provide a method and structure in which substrate flexure is minimized (or preferably eliminated) when under actuation loading while simultaneously maintaining module attributes and characteristics such as heat transfer and/or reworkability characteristics of the structure.

In one aspect of the present invention, an integrated circuit module includes a substrate which mounts at least one chip or discrete electronic component thereon, and a cap for covering the substrate, and including at least one protrusion coupled to the cap for limiting the amount of flexing of the substrate during actuation.

In another aspect of the present invention, a land grid assembly (LGA) includes a module having a substrate and a cap, the cap includes at least one protrusion for limiting the amount of flexing of the substrate during actuation, the at least one protrusion extending to a predetermined distance above a surface of the substrate when the module is sealed.

In yet another aspect of the invention, a method of forming a land grid assembly (LGA) module, the method including steps of preparing a cap including sealing legs respectively extending along an outer periphery (e.g., an "outer peripheral picture frame extension") of a first surface of the cap, and at least one integrally formed protrusion on the first surface of the cap intermediate the outer periphery, and joining a substrate to the outer periphery to form a sealed module, the at least one protrusion extending to a predetermined distance above a surface of the substrate when the module is sealed, wherein during a load condition on the substrate, the at least one protrusion suppresses an amount of flexing of the substrate.

With the unique and unobvious aspects of the present invention, a better solution to the problems of the conventional methods and designs is provided, in that the present invention avoids thicker substrates, as in the conventional systems and methods, which increases product cost and which could impact electrical performance.

Further, the present invention avoids use of more rigid substrate materials (e.g., such as alumina ceramic or the like) which may have inferior dielectric properties.

Specifically, the present invention utilizes one or more features which are employed to reduce substrate bowing under LGA socketing. Such a feature includes forming at least one protrusion on the inside of the cap structure which acts as solid stop(s) to limit substrate deformation. The at least one protrusion preferably extends to a predetermined, zero or small distance above the substrate, and may be rounded or capped with a soft material, such as an elastomer, to avoid contacting damage to the substrate. In some cases, the protrusions may be attached permanently to the substrate, such as by soldering. The protrusions may be discrete posts strategically located around the cap, or may be formed as walls.

With such features and others of the present invention, a method and module design are provided which protect a module from damage. Further, the method and structure of the invention minimizes and suppresses substrate flexure when under LGA actuation loading while simultaneously maintaining module attributes and characteristics such as heat transfer and/or reworkability characteristics of the structure.

Furthermore, the present invention is advantageous in harsh environments having severe mechanical shock and vibration characteristics and/or severe thermal characteristics. Specifically, the cap may undergo loading (and flex), thereby imparting load to the substrate. With the unique and unobvious combination of elements, the present invention advantageously protects the substrate in such environments.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figures 1, 2:
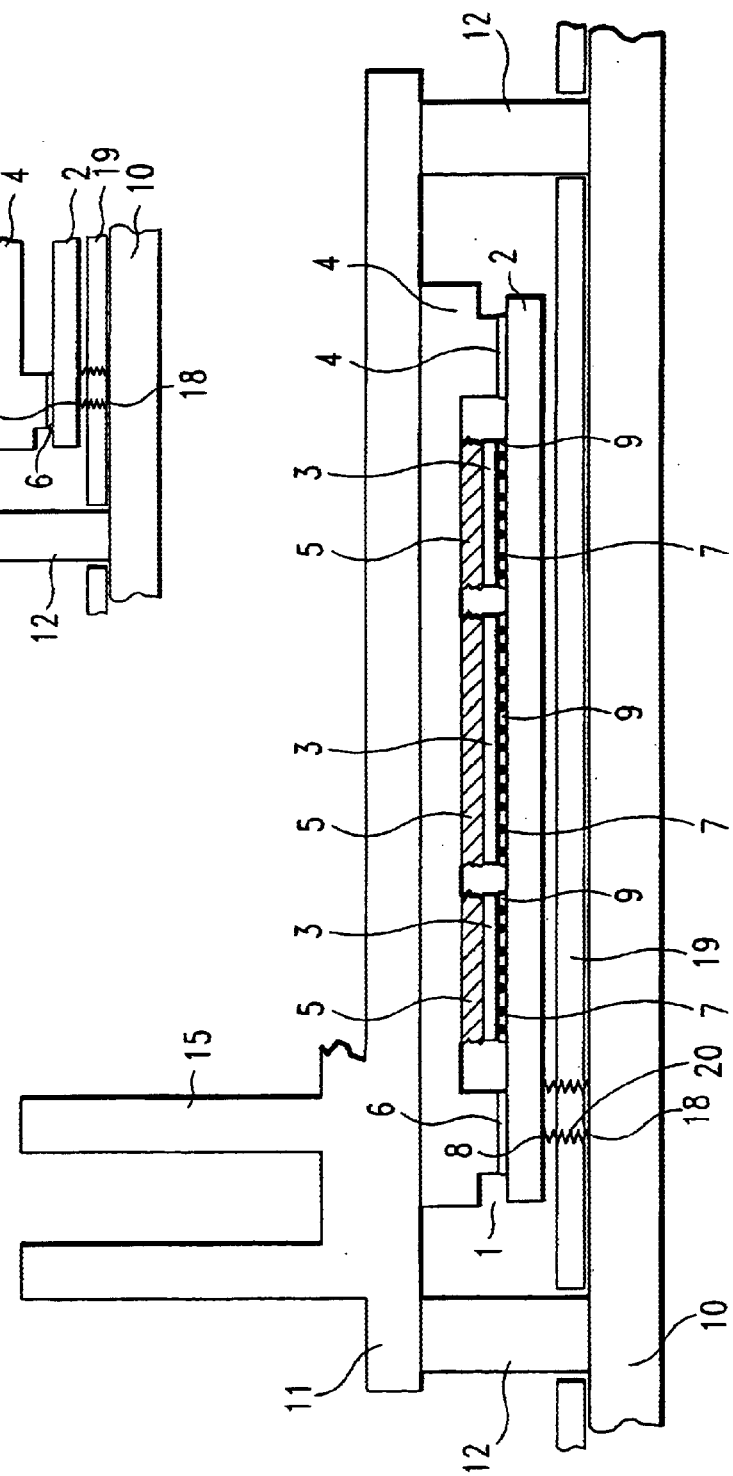
FIG. 1 shows a conventional LGA module actuated to a printed wiring board (PWB)
FIG. 2 shows an alternative configuration of the conventional I-GA module wherein posts are not required.
Figure 3:
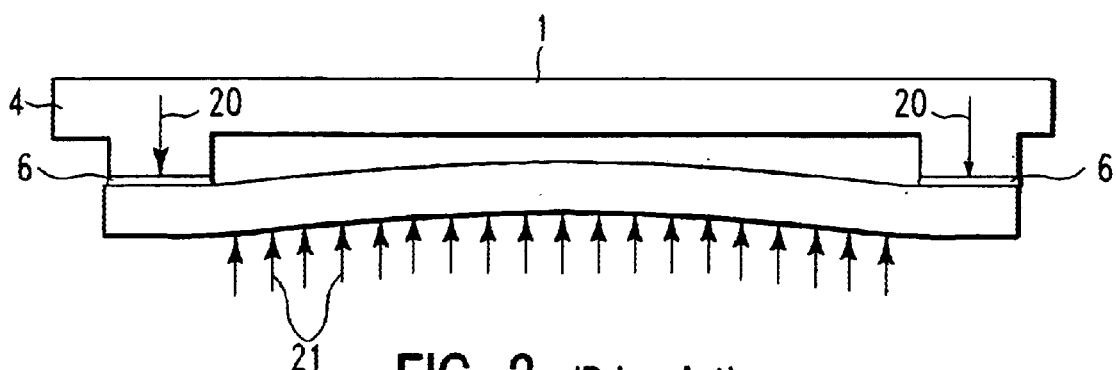
FIG. 3 shows the deformation pattern of an actuated conventional LGA module.

Referring now to the drawings, and more particularly to FIGS. 4–14, there are shown preferred embodiments of the method and structure according to the present invention. It is noted that the structure of the present invention is similar to that of the conventional designs shown in FIGS. 1 and 2, with the departures therefrom being described below, and which achieve the unexpectedly superior results of the present invention.

First Embodiment

Figure 4:
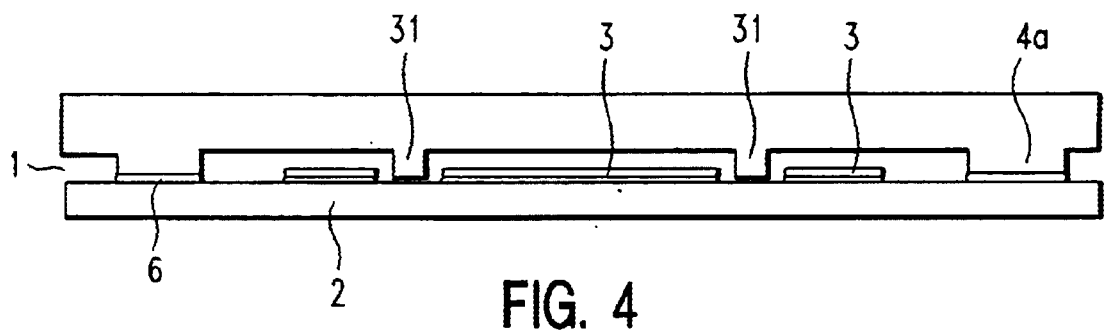
FIG. 4 shows a first embodiment of an LGA module according to the present invention.

Referring to FIG. 4, a cap 4 of a grid array (e.g., an LGA) module is shown which includes one or more protrusions 31 attached to or machined onto the cap 4 for limiting the degree (e.g., amount) to which the substrate 2 can flex during LGA actuation. The cap is generally rectangular or square-shaped. The protrusions 31 are preferably square-shaped or circular-shaped, but also may have other polygonal shapes or conical-shaped as required. Moreover, the protrusions 31 may be rounded or spherical at their ends facing the substrate.

Preferably, the protrusions 31 are integrally formed with the cap 4, as shown in FIG. 4. However, the protrusions could be formed separately and then mounted to the underside of the cap. Similarly, they may also be preattached to the substrate 2.

The cap preferably is formed of aluminum or other suitable metal or composite, and the substrate 2 is formed of dielectric layers containing interconnecting lines and through-vias. The protrusions 31 preferably extend to a predetermined zero or small distance above the substrate surface when the module 1 is sealed, as shown, magnified, in FIG. 5(a). For example, the small distance may be substantially within a range of about 0.000 inches to about 0.003 inches above the substrate surface.

Preferably, the protrusions have a width for abutting the substrate 2 of substantially in a range of about 1 mm to about 12 mm, and preferably about 2.5 mm. The width (e.g., diameter) of the protrusion may be constrained by the chips and other surface features which may be present on the substrate 2.

Preferably, the protrusions 31 are formed on the same plane as a bottom surface of cap 4 and extend therefrom by a uniform distance.

The bottom surfaces of the protrusions 31 are substantially on the same plane as an interface between the bottom surface of the "sealing legs" 4a (e.g., on the outer periphery of the cap 4) and seal band 6 and such that a clearance 32, substantially in the range of about 0.000 inches to about 0.003 inches, is provided between the bottom of the protrusions 31 and the top surface of the substrate 2. The clearance is the same as the small distance mentioned above.

It is noted that during machining of the cap to form the sealing legs 4a and the protrusions 31, preferably the protrusions are made slightly shorter than the bottom surface of the sealing legs 4a for greater performance and compensation. However, the bottom surface of the seal legs could be made a uniform length with the bottom surface of the protrusions (e.g., seal legs and protrusions are on the same plane).

Further, it is noted that having the protrusions 31 extend completely to the top surface of the substrate 2 or preloaded against the substrate 2 may also be is the optimum design, as the substrate 2 would be subject to minimum reverse flexure.

Figure 6A:
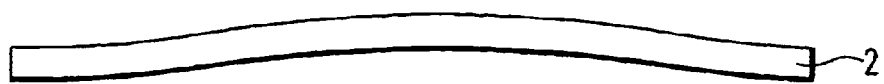
FIGS. 6(a)–6(c) show substrate flexure patterns of unconstrained module design, non-optimally constrained module design, and optimally constrained module design, respectively, according to the present invention.

FIG. 6(a) shows, schematically, the computed flexure profile of an LGA actuated (e.g., under load) substrate 2, without cap protrusions, representing the conventional LGA module shown, for example, in FIGS. 1 and 2.

Figure 6B:
Figure 6C:
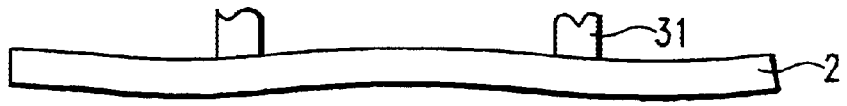

FIGS. 6(b) and 6(c) show computed profile drawings of the deformed substrate 2 when the substrate 2 has contacted the protrusions 31.

In FIG. 6(b), the cap protrusions 31 originally (without load) are flush against the substrate surface.

In FIG. 6(c), the cap protrusions 31 are located slightly above (e.g., by the small distance mentioned above within the range of, for example, about 0.000 to 0.003 inches from the substrate 2) the surface of the substrate 2 in the unloaded state.

Thus, the substrate 2 may deform a small distance upward (e.g., the clearance distance mentioned above of about 0.000 to about 0.003 inches) before the protrusions 31 are encountered. This configuration permits a small amount of upward deflection, but minimizes the worst case flexure. The optimum clearance (gap) 32 may be determined by calculation, but is typically in the range of about 0.000 to about 0.003 inches, as described above.

Figure 5A:
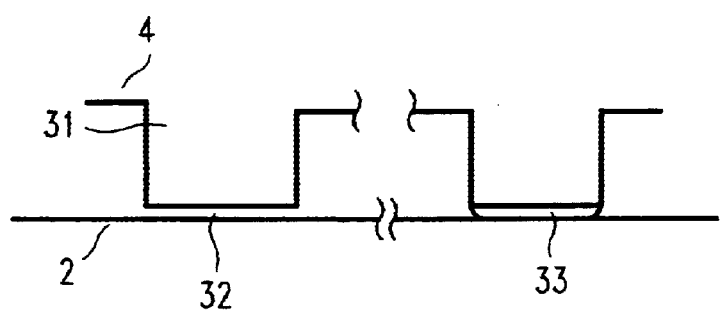
FIG. 5(a) shows a magnified view of a cap protrusion 31 of the LGA module including a soft elastomer material 33 at end of the cap protrusion 1 according to the present invention.
Figure 7:
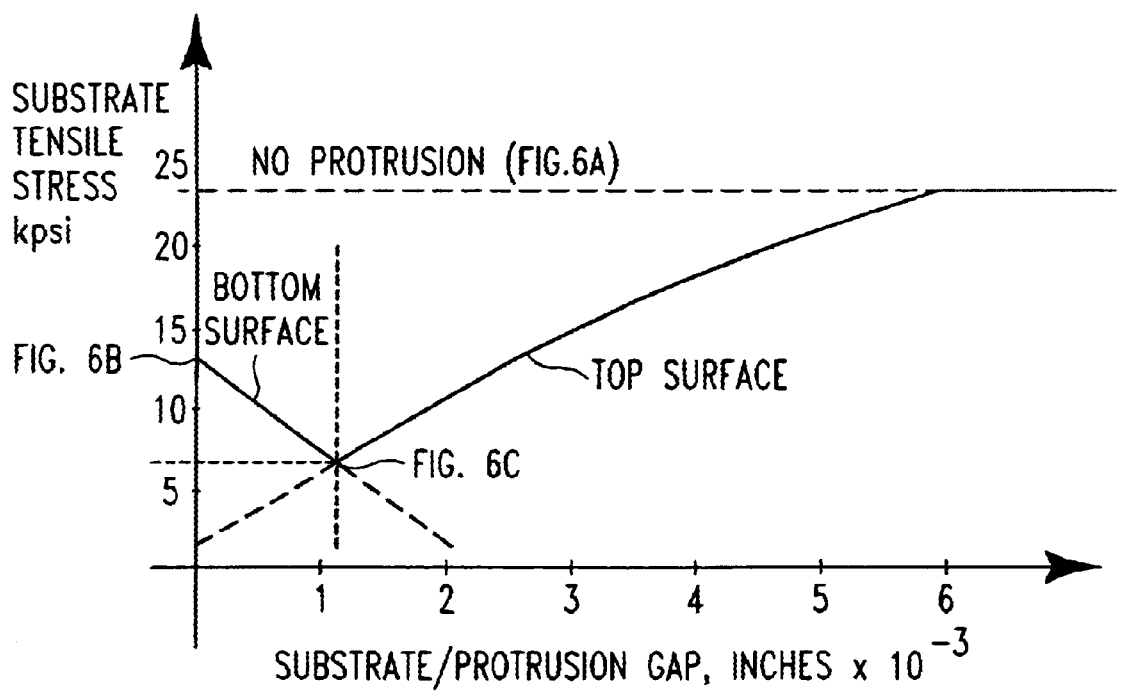
FIG. 7 shows a plot of substrate stress at top and bottom surfaces as a function of gap between protrusions and substrate surface in the unloaded state of the LGA module according to the present invention.

FIG. 7 shows a graph of substrate stress as a function of the thickness of the gap 32, for a particular design, showing the optimum value. The protrusions may be capped with a thin layer of soft material 33, as shown in FIG. 5(a), such as an elastomer (e.g., Sylgard 577® commercially available from Dow-Corning Inc.), which, when the module is assembled, occupies the gap 32.

Figure 5B:
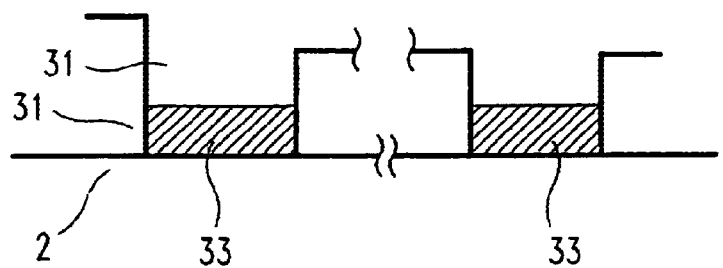
FIG. 5(b) illustrates an alternate configuration of the soft, elastomer material 33 being placed on the substrate 2.

Alternatively, as shown in FIG. 5(b), the elastomer material may be placed on predetermined areas of the substrate directly underneath the protrusion 31 and to conform to a shape of the protrusion 31 above. The elastomer may be the same as employed for the seal band 6. As noted above, the tip 32 for the protrusion 31 may be bonded concurrently with the attachment of the seal band 6 to the bottom surface of the sealing legs, or sequentially to the seal band.

For optimum efficiency, the protrusions 31 may be located about ⅓ to ¼ the diagonal distance from the center to the corner of the substrate 2, and preferably are symmetrically located/disposed around the center of the substrate. Further, while two protrusions are shown in the exemplary configuration of FIGS. 4–5(b), more than two protrusions or less than two protrusions (e.g., one protrusion) may be provided.

As a practical matter, the location of the chips and other components 3 will limit the availability of substrate real estate, and the protrusion location will have to be chosen from those substrate locations available. Typically, these locations will occur diagonally just outside the central chip.

Returning to the graph of FIG. 7 showing substrate stress as a function of protrusion/substrate gap for a typical high performance multi-chip substrate, without any cap protrusion the tensile stress at the top surface of the substrate from actuation is 23.1 kpsi.

As the protrusion 31 more and more closely approaches the substrate surface, that stress decreases, until, when the protrusion becomes flush against the substrate, it approaches zero. However, at this point, due to the reverse bend, the tensile stress at the bottom surface is 12.9 kpsi. when the gap is 0.0011 inches, both top and bottom surfaces have a maximum tensile stress of 6.5 kpsi, and this is an example of an optimum design.

Based on allowable strength, there is a bandwidth of gap permissible, which allows manufacturing tolerances to be accommodated. For instance, if the allowable substrate stress for the substrate of FIG. 7 is 10 kpsi, the nominal design gap should be 0.0011 inches, with an allowable tolerance of +0.0007"/−0.0006".

Figure 8:
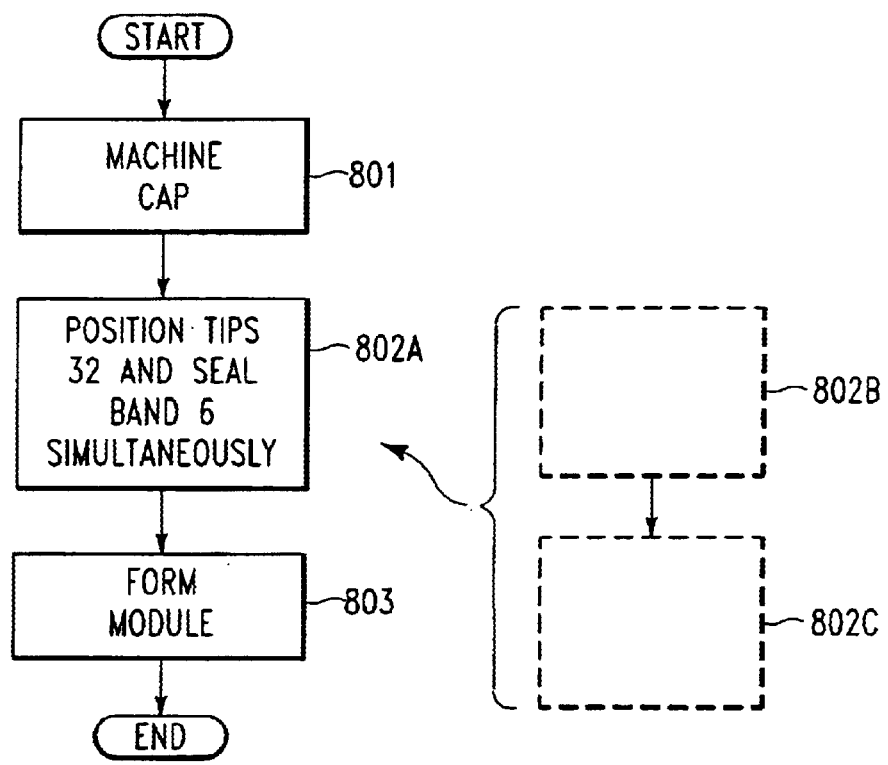
FIG. 8 illustrates a method of forming the module 1.

Turning to FIG. 8, a method of making the module for a land grid assembly (LGA) is shown. First, in step 801, the cap 4 is prepared by machining the same to include outer (e.g., peripheral) sealing legs 4a extending from a first (e.g., bottom) surface of the cap. The interior of the cap is routed out such that the protrusions 31 are formed intermediate the outer periphery of the cap 4.

Thereafter, an elastomer material is simultaneously dispersed and deposited on the protrusions 31 and on the sealing legs 4a (thereby to form the seal band 6), as shown in step 802.

It is noted that in lieu of step 802A, steps 802B and 802C may be performed sequentially in which, after the cap has been machined, the elastomer material is dispersed onto the protrusions (or the substrate), and then in 802C the elastomer is dispersed in a sequential operation onto the sealing legs 4a of the cap to form the seal band 6.

In step 803, the cap 4 is joined to the substrate 2 and the structure is cured, to form the module 1. Specifically, the sealing legs 4a of the cap are joined to the substrate to form a sealed module, and then cured by conventional techniques. when the module is sealed, the protrusions are positioned a predetermined distance above the opposing (e.g., top) surface of the substrate. Thus, during a load condition on the substrate, the protrusion(s) suppress an amount of flexing of the substrate.

Second Embodiment

Figure 9:
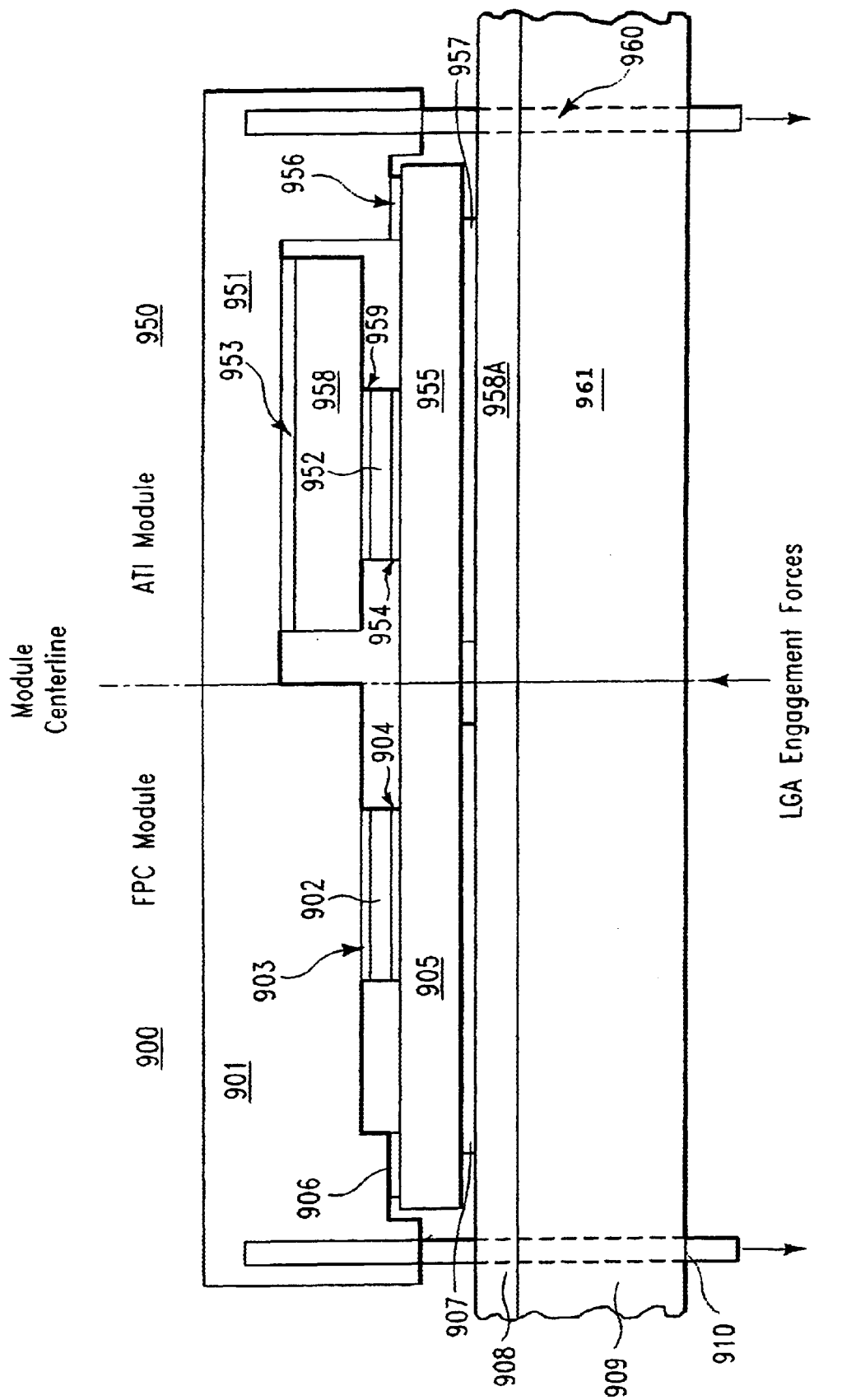
FIG. 9 illustrates a second embodiment of an LGA module according to the present invention, and more specifically a flat plate cooling (FPC) module and an adhesive thermal interface (ATI) module in which the second embodiment may be incorporated.

Turning now to FIG. 9, it is noted that the above structure while being very advantageous over the conventional structures can be optimized even further by a stress-resistant LGA package provided according to the second embodiment.

That is, as described above, the LGA module attachment causes an upward cambering of the chip carrier, which under severe conditions can cause fracture of the substrate, immediately upon socketing or subsequently.

While the first embodiment has provided a mechanism for accommodating such fracture conditions, the second embodiment provides a further means and more specifically an adjustable mechanism such as a post, stud, or spar to alleviating fracture conditions. That is, the second embodiment places a post, stud, or spar on the cooling cap which contacts or nearly contacts the substrate surface. As mentioned above, the first embodiment has the post machined into or rigidly attached to the cap. In the solution of the second embodiment, the post is inserted concurrently with or after sealing, thereby allowing its position to be tailored to the topology of the particular substrates, thereby permitting a more controllable approach.

Turning to FIG. 9, an exemplary structure is shown for incorporating the second embodiment. It is noted that FIG. 9 illustrates two exemplary structures (e.g., a flat plate cooling (FPC) module, an adhesive thermal interface (ATI) module, etc.) laid out side-by-side for comparison. That is, FIG. 9 is actually two half drawings of two separate types of modules (FPC and ATI).

As known in the art, FPC is a general type of encapsulation in which there is a cap which comes down very close to the chip and a thermal paste (e.g., ATC 3.8) is used between the upper surface of a die mounted on a substrate and the bottom surface of cap. ATI is similar to FPC, but also has an additional interposing thermal spreader (e.g., such as one of SiC) so that the chip has a spreader epoxied right down to the chip (e.g., via the die, etc.), and then the spreader has a thermal paste or adhesive interface directly mounted up to the cap. Both methods are for extracting heat from the module.

More specifically, as shown on the left-hand side in FIG. 9, an FPC module 900 is shown having a cap 901, a die 902 having, respectively, on first and second sides an adhesive or thermal compound 903 and interconnection array 904, optionally with an underfill, a substrate 905 coupled, via a Sylgard 577® seal 906 to the cap with the die 902 therebetween, a socket 907 coupled to an underside of the substrate 905, a card (printed circuit board) 908 coupled to the substrate with the socket therebetween, and a steel stiffener 909 coupled to the underside of the card 908. Engagement posts 910 and engagement spring (not shown) are also provided for applying LGA engagement load to the assembly.

As shown an the right-hand side in FIG. 9, an ATI module 950 is shown having a cap 951, a thermal spreader 958 having an adhesive or thermal compound 953 formed between the underside of the cap and the thermal spreader, a die 952 having, respectively, on first and second sides an adhesive thermal interface (ATI) 959 and interconnection array 954, optionally with an underfill, a substrate 955 coupled to the cap with the die 952 therebetween, a substrate 955 coupled, via a Sylgard 577® seal 956 to the cap with the die 952 therebetween a socket 957 coupled to an underside of the substrate 955, a card (printed circuit board) 958A coupled to the substrate with the socket therebetween, and a steel stiffener 961 coupled to the underside of the card 958A. Engagement posts 960 and engagement spring (not shown) are also provided for applying LGA engagement load to the assembly As is evident from FIG. 9, the ATI module differs mainly from the FPC module by the addition of the thermal spreader 958 and the ATI 959 formed at the interface of the die 952 and the thermal spreader 958.

It is noted that, as may be evident to one of ordinary skill in the art, regardless of the type, not every module is manufactured the same and with the same dimensions, clearances, etc. Thus, the adjustable spar accommodates these differences and eliminates such substrate flexure.

Figure 10:
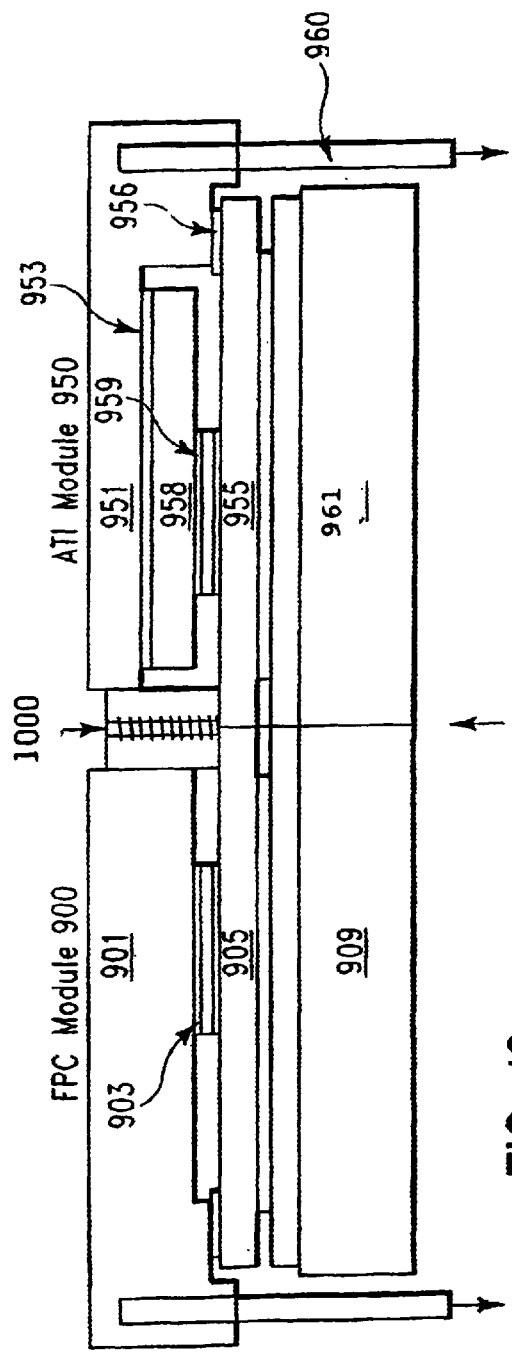
FIG. 10 illustrates the structure of the present invention in which an adjustable spar 1000 is provided.

FIG. 10 illustrates a post or stud (e.g., a spar) 1000 according to the second embodiment, which is provided so as to be positioned adjustably with respect to a substrate (905, 955). The spar 1000 can be employed with either the FPC or ATI-type of module, as shown in FIG. 10.

As mentioned above, LGA engagement forces cause excessive chip carrier bending, thereby resulting in excessive mechanical stresses (i.e., substrate fracture), excessive thermal paste displacement (e.g., thermal failure), and excessive variability in the LGA button contact load (i.e., electrical failure). Hence, to overcome these and other problems, the mechanical connection of the cap to the structure is made with the adjustable spar. Thus, unlike a fixed post or stud which may be exactly right for one module, but not right for another, the inventive structure including the adjustable spar can be adjusted for every module.

Figure 11:
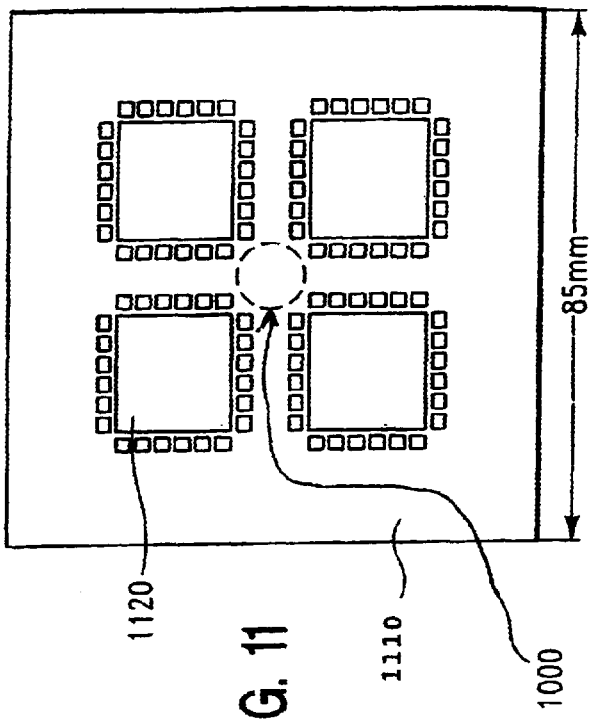
FIG. 11 illustrates a 4-chip 1120 substrate 1100 top surface layout including spar 1000 contact area.

FIG. 11 illustrates a plan view of a four chip, multi-chip module (MCM). That is, a substrate top surface 1110 is shown in which, for example, four chips 1120 are mounted. The entire module shown in FIG. 11 would be either an FPC module or an ATI module. Hence, the sectional view of a module shown in FIG. 9 corresponds to the plan view of the modules shown in FIG. 11. The substrate top surface has sides which have a predetermined length (e.g., about 85 mm in one exemplary embodiment).

Thus, in FIG. 11, if a cap were positioned over the substrate and a thermal paste was applied to each of the four chips, then an FPC module would be provided. The spar 1000 would be positioned likely in the center of the substrate top surface (e.g., between the four chips as shown by the dotted lines in FIG. 11). Thus, the spar 1000 contact would be located at the center of the substrate (e.g., as clearly shown in FIG. 10).

Figures 12, 14:
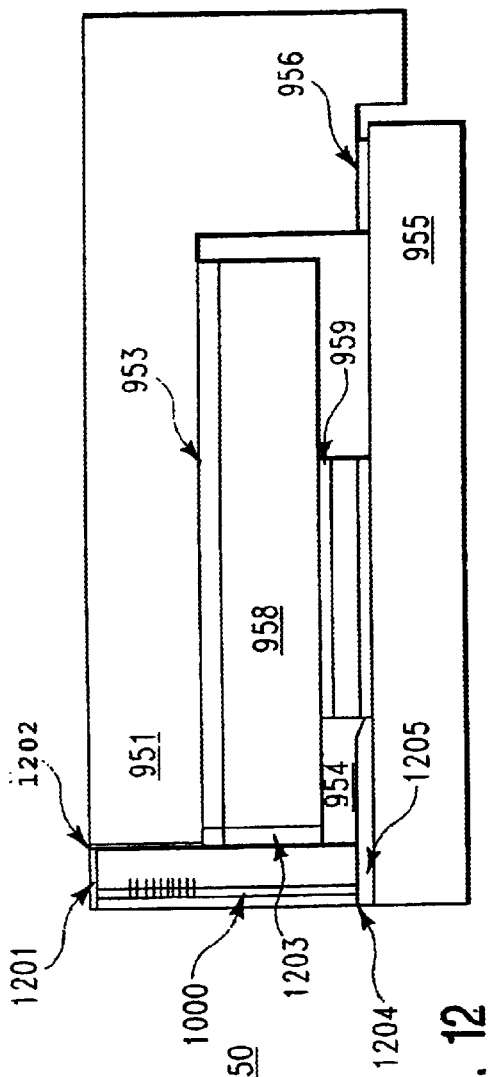
FIG. 12 illustrates the adjustable spar 1000 incorporated into an ATI module including a contact plate 1205.
FIG. 14 illustrates a table showing the effect of incorporating the spar on the module's mechanical performance.

FIG. 12 illustrates an exemplary implementation for an ATI-type module 950 which is similar to that shown in the right-hand side of FIG. 9 (and uses similar reference numerals for like elements). However, FIG. 12 is a much more detailed view of what is shown in FIG. 9.

As shown in FIG. 12, a portion of the ATI module 950 is shown having the cap 951, the thermal spreader 958 having an adhesive or thermal paste 953 formed between the underside of the cap and the SiC spreader, the die 952 having, respectively, on first and second sides the adhesive thermal interface 959 and the interconnection array 954, optionally with an underfill 954, the substrate 955 coupled to the cap with the die 952 therebetween, the substrate 955 being coupled, via a Sylgard 577® seal 956 to the cap with the die 952 therebetween, and the socket 957 (FIG. 9) coupled to an underside of the substrate 955.

As further shown in FIG. 12, a thread sealing material 1201 is provided. It is noted that, for example, a through hole 1202 is drilled and tapped in the cap 951, and then the spar 1000 is inserted and threaded down to touch or nearly touch substrate 955. In an exemplary implementation, the spar can be an M8 Stainless Steel set-screw or the like. Preferably, the thermal spreader's corner is chamfered for spar clearance, as shown at reference numeral 1203 in FIG. 12. Preferably, there is a relatively large radius on the spar contact tip for smooth load application, as shown at reference numeral 1204.

Additionally, an optional contact plate 1205 may be formed to spread the spar reaction load for even further improvement (e.g., preferably having a cylindrical or cross-shape). This contact plate 1205 would serve to further protect a brittle substrate surface such as glass ceramic 955.

Figure 13:
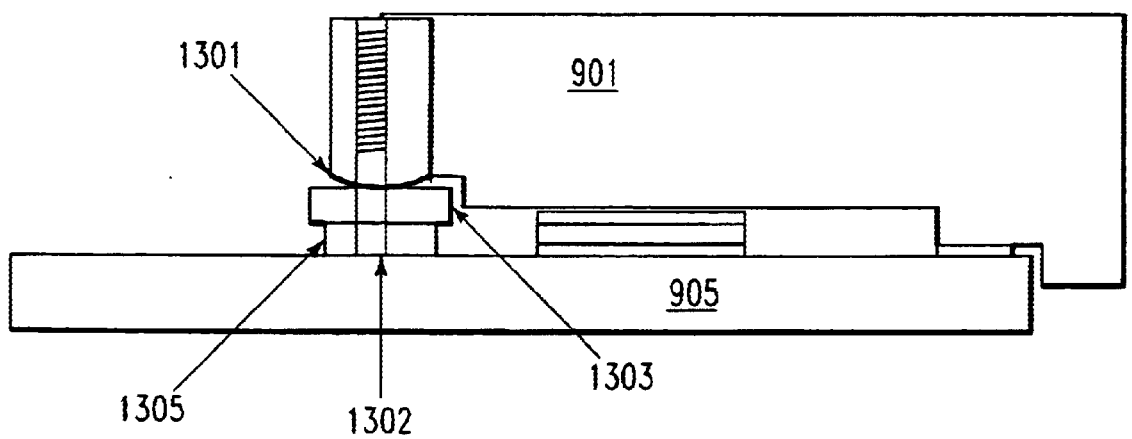
FIG. 13 illustrates a partial structure similar to that of FIG. 12 incorporated into an FPC module which includes a contact plate 1305 which is a modification of the contact plate 1205 of FIG. 13.

FIG. 13 illustrates an exemplary implementation of an FPC-type module 900 which is similar to that shown on the left-hand side of FIG. 9 and uses similar reference numerals for like elements. However, FIG. 13 is a much more detailed view of what is shown in FIG. 9. However, a difference between FIGS. 12 and 13 lies in a contact plate (e.g., spar bearing plate) 1305 of FIG. 13 which is similar to the contact plate 1205 of FIG. 12. As shown, the contact plate 1305 is designed to protect the substrate from the spar 1301. That is, the contact plate 1305 serves to spread the load and substrate stress and also prevents the spar 1301 from scratching the surface of the substrate 905.

Further, as shown at reference numeral 1301, the spar 1300 is shortened with an increased tip radius (e.g., about 100 mm in an exemplary embodiment) for centralized contact to the plate.

As shown at reference numeral 1302, preferably contact plate 1350 is adhesively attached to the substrate during a seal cure. Further, as shown at reference numeral 1303, the contact plate 1305 is retained and located on the substrate 905 using a counter bore in the cap and a novel assembly fixture.

FIG. 14 illustrates a table showing the effect of incorporating the spar on the module's mechanical performance, given a 6.9 mm thick substrate and a 144 gm/IO average load. As shown, performance was greatly enhanced by incorporating the spar into a module.

It is noted that the spar is shown generally in the center of the ATI (or FPC) module. However, the positioning of the spar is not limited thereto. Moreover, multiple spars could be provided on the same cap.

Further, it is noted that the spar is preferably threaded. The threaded nature of the spar is useful because the user actuates it by turning (rotating) the spar, and the turning of the spar is a very sensitive way (e.g., as opposed to merely pushing the spar downward until the substrate is reached) of sensing when the spar reaches the top surface of the substrate and retaining such position. As such, the spar has a cylindrical shape with helical threads formed therein, thereby giving it an appearance of a screw.

However, while the spar is preferably threaded, the spar need not be threaded as shown in FIG. 12 (or 13). For example, the spar could be made as a solid stud (or rivet) and then adjusted positioned (fixed in place) by other means such as by using an epoxy, etc.

It is further noted that many of the features of the first embodiment can be advantageously used with the second embodiment. That is, a soft elastomer cushioning material, such as that shown at reference numeral 33 in FIG. 5(b), could be fixed on the tip of the spar for contacting the substrate and thereby cushioning the substrate from the relatively hard spar. Alternatively, such a soft elastomer material could be formed on the substrate at a position where the tip of the spar is expected to contact.

With the second embodiment, better control can be obtained for positioning the spar in relation to the substrate. The dimensions of the stand-off (offset) can be very precisely controlled by adjusting the spar to a predetermined stand-off (offset) following module assembly. In this way, substrate deflections and resulting mechanical stresses and substrate damage can be minimized.

Further, this embodiment can be used advantageously with assemblies requiring a fixed, but small gap between the substrate and spar tip for optimum stress control. The spar can be threaded down until contact with the substrate is detected, and then reverse-threaded by a predetermined amount. Thus, designing the spar thread pitch and reverse-threading amount can selectively achieve an accurate gap to a high degree of accuracy.

Further, with the second embodiment, some key benefits of an adjustable spar over a non-adjustable spar include that the substrate mechanical stresses can be further reduced by approximately 60–80%. Additionally, the thermal paste strain can be further reduced by approximately 4–5 fold, and the minimum button contact load can be increased by approximately 10–20%.

Additionally, with the second embodiment, the invention is widely applicable to large LGA module form factors. Additionally, the invention potentially allows the use of thermal pastes that are sensitive to pumping or other mechanical displacements.

While the invention has been described in terms of several preferred embodiments, those skilled in the an will recognize that the invention can be practiced with modification within the spirit and scope of the appended claims.

What is claimed is:

1. A land grid assembly (LGA) comprising:

a module having a substrate, a cap, and at least one chip, said cap including at least one protrusion for limiting an amount of flexing of the substrate during actuation, said at least one protrusion being in opposed relation to a surface of the substrate, being spaced from said at least one chip and extending to a predetermined distance above the surface of the substrate when the module is sealed, wherein a position of said at least one protrusion is selectively adjustable in relation to said substrate, wherein said at least one protrusion comprises an adjustable spar, a screw or a set-screw.

2. A land grid assembly (LGA) comprising:

a module having a substrate, a cap, and at least one chip, said cap including at least one protrusion for limiting an amount of flexing of the substrate during actuation, said at least one protrusion being in opposed relation to a surface of the substrate, being spaced from said at least one chip and extending to a predetermined distance above the surface of the substrate when the module is sealed, wherein a position of said at least one protrusion is selectively adjustable in relation to said substrate, wherein said at least one protrusion is rotated to be threaded through said cap to adjust a distance of a bottom of said protrusion from a top surface of said substrate.

3. A land grid assembly (LGA) comprising:

a module having a substrate, a cap, and at least one chip, said cap including at least one protrusion for limiting an amount of flexing of the substrate during actuation, said at least one protrusion being in opposed relation to a surface of the substrate, being spaced from said at least one chip and extending to a predetermined distance above the surface of the substrate when the module is sealed, wherein a position of said at least one protrusion is selectively adjustable in relation to said substrate, wherein said at least one protrusion comprises a rivet for being adjustably inserted through said cap.

4. A land grid assembly (LGA) comprising:

a module having a substrate, a cap, and at least one chip, said cap including at least one protrusion for limiting an amount of flexing of the substrate during actuation, said at least one protrusion being in opposed relation to a surface of the substrate, being spaced from said at least one chip and extending to a predetermined distance above the surface of the substrate when the module is sealed, wherein a position of said at least one protrusion is selectively adjustable in relation to said substrate, wherein said at least one protrusion comprises a threaded cylindrical object.

5. A land grid assembly (LGA) comprising:

a module having a substrate, a cap, and at least one chip, said cap including at least one protrusion for limiting an amount of flexing of the substrate during actuation, said at least one protrusion being in opposed relation to a surface of the substrate, being spaced from said at least one chip and extending to a predetermined distance above the surface of the substrate when the module is sealed, wherein a position of said at least one protrusion is selectively adjustable in relation to said substrate, wherein said at least one protrusion is adjustably fitted through said cap such that a bottom surface of said at least one protrusion is flush with a top surface of said substrate.

6. A land grid assembly (LGA) comprising:

a module having a substrate, a cap, and at least one chip, said cap including at least one protrusion for limiting an amount of flexing of the substrate during actuation, said at least one protrusion being in opposed relation to a surface of the substrate, being spaced from said at least one chip and extending to a predetermined distance above the surface of the substrate when the module is sealed, wherein a position of said at least one protrusion is selectively adjustable in relation to said substrate, wherein said at least one protrusion is adjustably fitted to form a predetermined gap between a tip of said at least one protrusion and said substrate.

7. A land grid assembly (LGA) comprising:

a module having a substrate, a cap, and at least one chip, said cap including at least one protrusion for limiting an amount of flexing of the substrate during actuation, said at least one protrusion being in opposed relation to a surface of the substrate, being spaced from said at least one chip and extending to a predetermined distance above the surface of the substrate when the module is sealed, wherein a position of said at least one protrusion is selectively adjustable in relation to said substrate, wherein said at least one protrusion includes threads which are sealed to prevent leakage and retain the protrusion position.

\* \* \* \* \*